United States Patent
Chiba et al.

(10) Patent No.: US 12,127,481 B2
(45) Date of Patent: Oct. 22, 2024

(54) DIELECTRIC ELASTOMER TRANSDUCER INCLUDING A DIELECTRIC ELASTOMER LAYER AND A PAIR OF ELECTRODE LAYERS SANDWICHING THE DIELECTRIC ELASTOMER LAYER

(71) Applicants: Seiki Chiba, Tokyo (JP); Mikio Waki, Sakura (JP); ZEON CORPORATION, Tokyo (JP)

(72) Inventors: Seiki Chiba, Tokyo (JP); Mikio Waki, Sakura (JP); Syo Kurita, Tsu (JP)

(73) Assignees: Seiki Chiba, Tokyo (JP); Mikio Waki, Sakura (JP); ZEON CORPORATION, Tokyo (JP)

( * ) Notice: Subject to any disclaimer, the term of this patent is extended or adjusted under 35 U.S.C. 154(b) by 815 days.

(21) Appl. No.: 17/287,380

(22) PCT Filed: Oct. 28, 2019

(86) PCT No.: PCT/JP2019/042088
§ 371 (c)(1),
(2) Date: Apr. 21, 2021

(87) PCT Pub. No.: WO2020/095737
PCT Pub. Date: May 14, 2020

(65) Prior Publication Data
US 2021/0384410 A1    Dec. 9, 2021

(30) Foreign Application Priority Data
Nov. 6, 2018 (JP) .................................. 2018-208699

(51) Int. Cl.
*H01L 41/113*    (2006.01)
*H01L 41/047*    (2006.01)
(Continued)

(52) U.S. Cl.
CPC .......... *H10N 30/308* (2023.02); *H10N 30/098* (2023.02); *H10N 30/877* (2023.02)

(58) Field of Classification Search
CPC ... H10N 30/098; H10N 30/308; H10N 30/877
(Continued)

(56) References Cited

U.S. PATENT DOCUMENTS

2013/0207793 A1*   8/2013   Weaber .................. G06F 3/041
                                                                              340/407.2

FOREIGN PATENT DOCUMENTS

JP      2009041463 A     2/2009
JP      2011188720 A     9/2011
(Continued)

OTHER PUBLICATIONS

Jan. 21, 2020, International Search Report issued in the International Patent Application No. PCT/JP2019/042088.
(Continued)

*Primary Examiner* — Emily P Pham
*Assistant Examiner* — Monica Mata
(74) *Attorney, Agent, or Firm* — KENJA IP LAW PC

(57) ABSTRACT

A dielectric elastomer transducer includes a dielectric elastomer layer, a pair of electrode layers sandwiching the dielectric elastomer layer, and a support that supports the dielectric elastomer layer. The dielectric elastomer layer includes a movable region separated from the support and a fixed region supported by the support. A pair of conduction paths are established that are configured to conduct electricity to the electrode layers via power cables and power supply points at which core wires of the power cables are electrically connected, respectively. The power supply points are separated from the movable region of the dielectric elastomer layer.

2 Claims, 4 Drawing Sheets

(51) Int. Cl.
  *H01L 41/45* (2013.01)
  *H10N 30/098* (2023.01)
  *H10N 30/30* (2023.01)
  *H10N 30/87* (2023.01)

(58) Field of Classification Search
  USPC .......................................................... 310/339
  See application file for complete search history.

(56) References Cited

FOREIGN PATENT DOCUMENTS

| | | |
|---|---|---|
| JP | 2016225599 A | 12/2016 |
| JP | 2018149488 A | 9/2018 |

OTHER PUBLICATIONS

May 30, 2023, Notification of Reasons for Refusal issued by the Japan Patent Office in the corresponding Japanese Patent Application No. 2018-208699.

Sep. 5, 2023, Notification of Reasons for Refusal issued by the Japan Patent Office in the corresponding Japanese Patent Application No. 2018-208699.

\* cited by examiner

DIELECTRIC ELASTOMER TRANSDUCER INCLUDING A DIELECTRIC ELASTOMER LAYER AND A PAIR OF ELECTRODE LAYERS SANDWICHING THE DIELECTRIC ELASTOMER LAYER

TECHNICAL FIELD

The present invention relates to a dielectric elastomer transducer.

BACKGROUND ART

A dielectric elastomer transducer, which includes a dielectric elastomer layer and a pair of electrode layers sandwiching the dielectric elastomer layer, has been proposed as a device that can be used for a variety of applications such as an actuator, a power generation element and a sensor. Patent Document 1 discloses an example of a conventional dielectric elastomer transducer. In the dielectric elastomer transducer, a power cable is connected to each of the paired electrode layers sandwiching the dielectric elastomer layer.

TECHNICAL REFERENCE

Patent Document

Patent Document 1: JP-A-2011-188720

SUMMARY OF THE INVENTION

Problems to be Solved by the Invention

In the configuration disclosed in Patent Document 1, the power supply point at which the core wire of a power cable is connected to the electrode layer is provided in an area that deforms during the operation of the dielectric elastomer transducer. With such a configuration, when an excessive load is exerted on the power supply point due to long use, a failure such as electrical disconnection may occur, which may lead to poor durability.

The present invention has been proposed under the above-noted circumstances, and an object of the present invention is to provide a dielectric elastomer transducer that is capable of improving the durability.

Means for Solving the Problems

According to the present invention, there is provided a dielectric elastomer transducer comprising: a dielectric elastomer layer; a pair of electrode layers sandwiching the dielectric elastomer layer; and a support that supports the dielectric elastomer layer. The dielectric elastomer layer includes a movable region separated from the support and a fixed region supported by the support. A pair of conduction paths are established each of which is configured to conduct electricity to a respective one of the electrode layers via a power cable and a power supply point at which a core wire of the power cable is electrically connected. The power supply points are separated from the movable region of the dielectric elastomer layer.

In a preferred embodiment of the present invention, the transducer further comprises a pair of intermediate conductive members, where the electrode layers are electrically connected to the intermediate conductive members, respectively, and the power supply points are provided by electrically connecting the core wires of the power cables and the intermediate conductive members.

In a preferred embodiment of the present invention, the intermediate conductive members are supported by the support.

In a preferred embodiment of the present invention, the intermediate conductive members are made of a material capable of deformation including bend, expansion and contraction and electrically connected to the electrode layers in the movable region. The power supply points are provided by electrically connecting the core wires of the power cables and portions of the intermediate conductive members that are separated from the movable region.

Advantages of Invention

According to the present invention, the durability of the dielectric elastomer transducer is improved.

Other features and advantages of the present invention will become clearer from the detailed description given below with reference to the accompanying drawings.

MODE FOR CARRYING OUT THE INVENTION

Preferred embodiments of the present invention are described below with reference to the accompanying drawings.

In the present disclosure, the terms such as "first" and "second" are used merely as labels and are not necessarily intended to order the objects.

Figure 1:
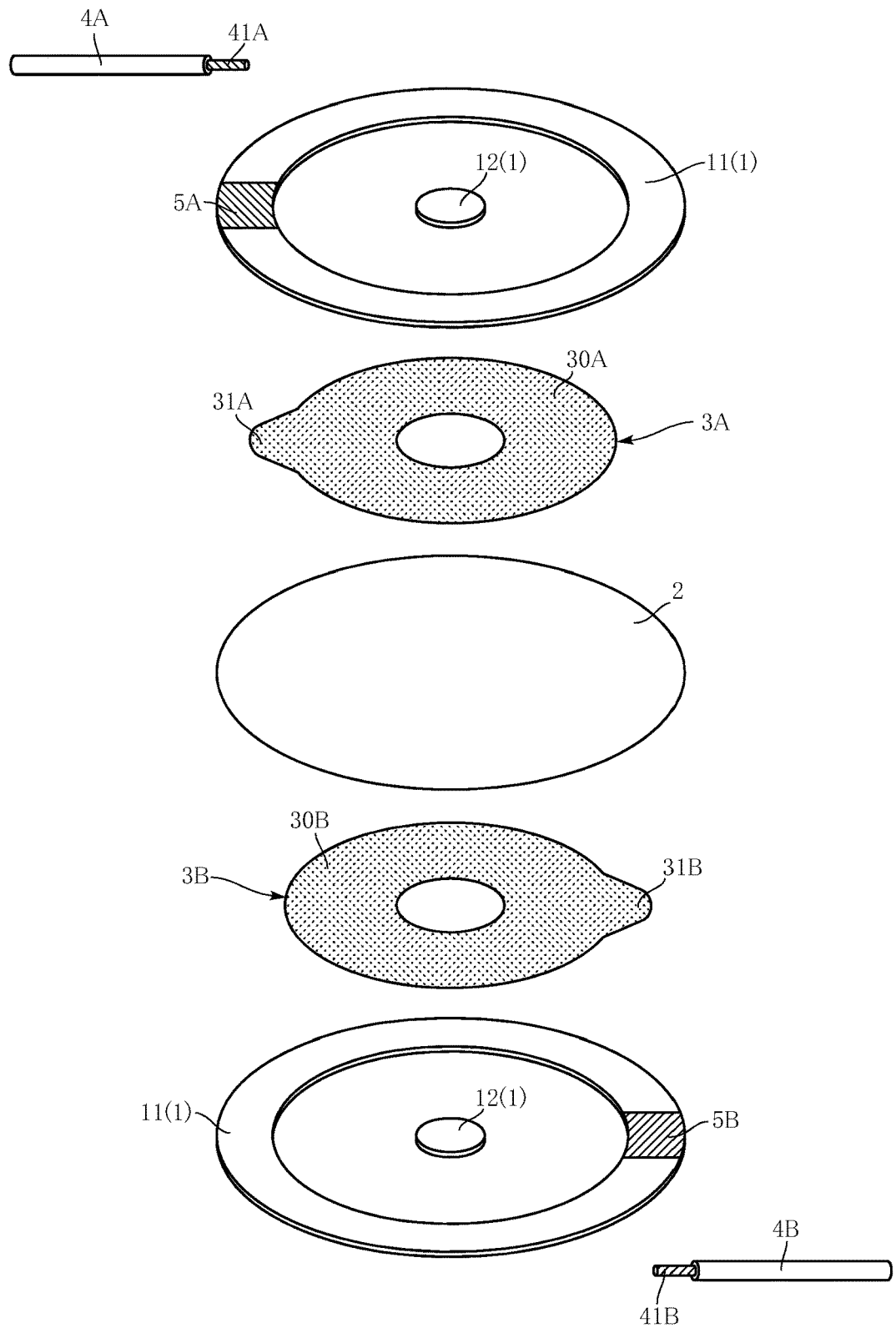
FIG. 1 is an exploded perspective view showing a dielectric elastomer transducer according to a first embodiment of the present invention.
Figure 2:
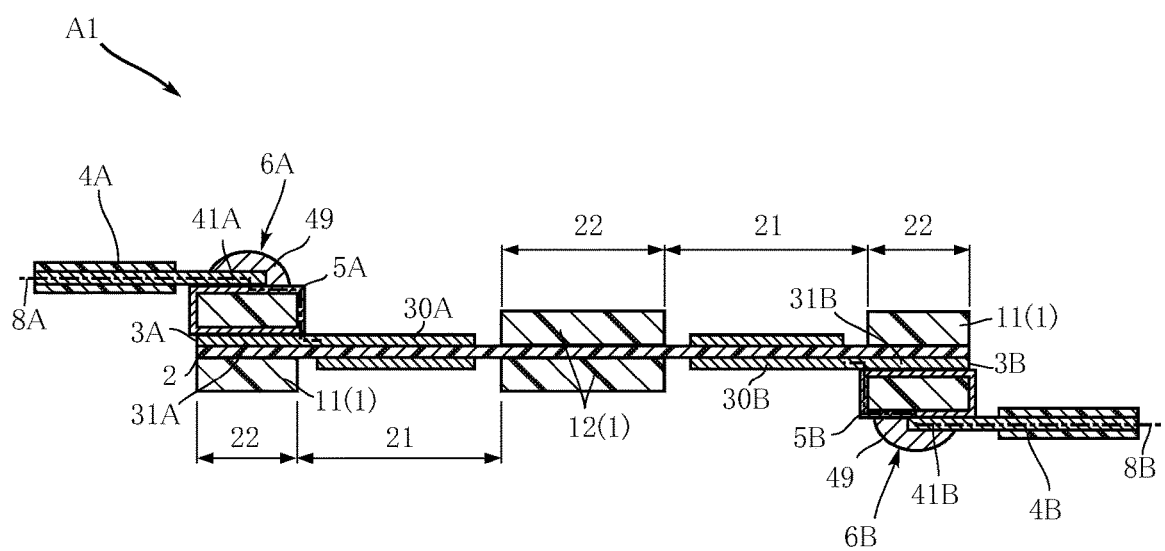
FIG. 2 is a sectional view showing the dielectric elastomer transducer according to the first embodiment of the present invention.

FIGS. 1 and 2 shows a dielectric elastomer transducer according to a first embodiment of the present invention. The dielectric elastomer transducer A1 of the present embodiment includes a support 1, a dielectric elastomer layer 2, a pair of electrode layers 3A, 3B, a pair of power cables 4A, 4B, and a pair of intermediate conductive members 5A, 5B. The dielectric elastomer transducer according to the present invention can be used for a variety of applications such as an actuator, a power generation element and a sensor. Hereinafter, an example in which the dielectric elastomer transducer A1 is used as an actuator described.

The support 1 supports the dielectric elastomer layer 2. The material for the support 1 is not particularly limited, and an insulating material such as resin is preferably used. The specific configuration of the support 1 is not particularly limited, and the support may have any configuration capable of supporting the dielectric elastomer layer 2. In the present embodiment, the support 1 has a pair of frame parts 11 and a pair of center parts 12.

The paired frame parts 11, each of which may have the shape of a circular ring, are arranged to overlap with each other in its axial direction. The paired center parts 12, each of which may be circular, are enclosed in the frame parts 11. The paired center parts 12 are arranged to overlap with each other in the axial direction of the frame parts 11.

The paired intermediate conductive members 5A and 5B are provided to electrically connect the paired electrode layers 3A and 3B to the paired power cables 4A and 4*b*, respectively. The specific configuration of the intermediate conductive members 5A, 5B is not particularly limited. In the present embodiment, the intermediate conductive members are formed of metal films such as Cu films fixed to the frame parts 11. The intermediate conductive member 5A is provided at the frame part 11 on the upper side in the figures, whereas the intermediate conductive member 5B is provided at the frame part 11 on the lower side in the figures. In the illustrated example, in the section shown in FIG. 2, each of the intermediate conductive members 5A, 5B covers the upper and the lower surfaces as well as the radially inner and the radially outer surfaces of a portion of the relevant frame part 11. However, each intermediate conductive member may be configured to cover a surface or surfaces selected from the upper and the lower surfaces and the radially inner and the radially outer surfaces of a portion of the relevant frame part 11.

Considering that the dielectric elastomer transducer A1 may to be used as an actuator, the dielectric elastomer layer 2 needs to be elastically deformable and have a high dielectric strength. Preferable examples of the material for the dielectric elastomer layer 2 that satisfy such needs include, but not limited to, silicone elastomers and acrylic elastomers. The specific configuration of the dielectric elastomer layer 2 is not particularly limited. In the present embodiment, the dielectric elastomer layer 2 has a circular shape.

The dielectric elastomer layer 2 is supported by the support 1. In the present embodiment, the dielectric elastomer layer 2 is sandwiched between the paired frame parts 11. The dielectric elastomer layer 2 is also sandwiched between the paired center parts 12. The means to fix the paired frame parts 11 and the paired center parts 12 to the dielectric elastomer layer 2 is not particularly limited, and any suitable means such as adhesion may be employed.

The dielectric elastomer layer 2 has a movable region 21 and a fixed region 22. The movable region 21 is a portion that is separated from the support 1 and that deforms when the dielectric elastomer transducer A1 operates as an actuator, for example. In the present embodiment, the movable region 21 has the shape of a circular ring. The fixed region 22 is a portion fixed to the support 1. In the present embodiment, the fixed region 22 includes a portion having the shape of a circular ring and fixed to the frame parts 11, and a circular portion fixed to the center parts 12.

The paired electrode layers 3A and 3B, which sandwich the dielectric elastomer layer 2, are configured to receive voltage from a power supply (not shown). The paired electrode layers 3A, 3B are made of a material that is electrically conductive and capable of elastic deformation following the elastic deformation of the dielectric elastomer layer 2. Examples of such a material include a material obtained by mixing a filler, for providing conductivity, into an elastically-deformable main material. A preferable example of the filler may be carbon nanotubes. The specific configuration of the paired electrode layers 3A, 3B is not particularly limited. In the present embodiment, the electrode layer 3A has a main part 30A and an extension 31A, whereas the electrode layer 3B has a main part 30B and an extension 31B.

The main part 30A has the shape of a circular ring. The outer diameter of the main part 30A is smaller than the inner diameter of the frame parts 11. The inner diameter of the main part 30A is larger than the outer diameter of the center parts 12. The extension 31A extends radially outward from the main part 30A. The specific shape of the extension 31A is not particularly limited and is a generally triangular shape with an arcuate end in the illustrated example.

The main part 30B has the shape of a circular ring. The outer diameter of the main part 30B is smaller than the inner diameter of the frame parts 11. The inner diameter of the main part 30B is larger than the outer diameter of the center parts 12. The extension 31B extends radially outward from the main part 30B. The specific shape of the extension 31B is not particularly limited and is a generally triangular shape with an arcuate end in the illustrated example.

The paired electrode layers 3A, 3B are disposed on opposite sides of the dielectric elastomer layer 2. The main parts 30A, 30B are arranged in the movable region 21 of the dielectric elastomer layer 2. The extensions 31A, 31B are arranged so as to span from the movable region 21 to the annular portion outside the fixed region 22. The illustrated extensions 31A and 31B extend to the opposite sides in the radial direction (horizontal direction in the figure).

In the present embodiment, the intermediate conductive member 5A intervenes between the extension 31A and the relevant frame part 11. The extension 31A and the intermediate conductive member 5A are electrically connected to each other by mutual contact or electrical bonding using a conductive bonding material (not shown). Also, the intermediate conductive member 5B intervenes between the extension 31B and the relevant frame part 11. The extension 31B and the intermediate conductive member 5B are electrically connected to each other by mutual contact or electrical bonding using a conductive bonding material (not shown).

The paired power cables 4A, 4B are used to apply a voltage from a power supply (not shown) to the paired electrode layers 3A, 3B. In the present embodiment, the core wire 41A of the power cable 4A is electrically connected to the intermediate conductive member 5A. The manner of electrical connection between the core wire 41A and the intermediate conductive member 5A is not particularly limited. In the illustrated example, the core wire 41A is bonded for electrical connection to the upper surface in the figures of the intermediate conductive member 5A with a conductive bonding material 49 such as solder, for example. Also, the core wire 41B of the power cable 4B is electrically connected to the intermediate conductive member 5B. The manner of electrical connection between the core wire 41B and the intermediate conductive member 5B is not particularly limited. In the illustrated example, the core wire 41B is bonded for electrical connection to the lower surface in the figures of the intermediate conductive member 5B with a conductive bonding material 49 such as solder, for example.

In the present embodiment, the point at which the core wire 41A is electrically connected to the intermediate conductive member 5A is a power supply point 6A. Also, the point at which the core wire 41B is electrically connected to the intermediate conductive member 5B is a power supply point 6B.

In the present embodiment, a conduction path 8A passing through the power supply point 6A is established. Specifically, the conduction path 8A includes the core wire 41A of the power cable 4A, the intermediate conductive member 5A and the electrode layer 3A. A conductive bonding material 49 may intervene between the core wire 41A and the intermediate conductive member 5A. Also, in the present embodiment, a conduction path 8B passing through the power supply point 6B is established. Specifically, the conduction path 8B includes the core wire 41B of the power cable 4B, the intermediate conductive member 5B and the electrode layer 3B. A conductive bonding material 49 may intervene between the core wire 41B and the intermediate conductive member 5B.

In the case where the dielectric elastomer transducer A1 is operated as an actuator, an unillustrated weight is attached to the center parts 12. In FIG. 2, with the up-down direction in FIG. 2 corresponding to the vertical direction, the center parts 12 move downward in the figure due to the weight. This causes the movable region 21 of the dielectric elastomer layer 2 to expand, producing a tension in the movable region 21. This is the initial state.

Then, a voltage is applied through the conduction paths 8A, 8B to the paired electrode layers 3A, 3B. When the voltage is applied such that the electrode layer 3A has a positive potential and the electrode layer 3B has a negative potential, for example, the electrode layer 3A and the electrode layer 3B attract each other due to Coulomb force. As a result, the dielectric elastomer layer 2 deforms so as to become thinner. Since the volume of the dielectric elastomer layer 2 does not change, its area increases as its thickness decreases. As a result, the movable region 21 of the dielectric elastomer layer 2 further expands due to the weight, so that the center parts 12 further move downward in the figure. In this way, by controlling the voltage application to the paired electrode layers 3A, 3B, the expansion state of the movable region 21 of the dielectric elastomer layer 2 can be changed, and moving the center parts 12 in the up-down direction in the figure allows the dielectric elastomer transducer A1 to function as an actuator. The means to produce a tension in the dielectric elastomer layer 2 in the initial state is not particularly limited, and various conventional means such as pulling with a structure may be used instead of using a weight.

The advantages of the dielectric elastomer transducer A1 are described below.

According to the present embodiment, the power supply points 6A, 6B at which the core wires 41A, 41B are electrically connected are spaced apart from the movable region 21. Thus, even when deformation of the movable region 21 such as expansion or contraction occurs during the operation of the dielectric elastomer transducer A1, significant deformation or movement does not occur at the power supply points 6A, 6B. This prevents failures such as electrical disconnection of the core wires 41A, 41B at the power supply points 6A, 6B. Thus, the durability of the dielectric elastomer transducer A1 is improved.

In the present embodiment, the power supply points 6A, 6B are provided by bonding the core wires 41A, 41B to the intermediate conductive members 5A, 5B for electrical connection. The intermediate conductive members 5A, 5B are formed of metal films disposed at the frame parts 11. The frame parts 11 are the portions that are hardly influenced by the deformation, if occurs, of the movable region 21 of the dielectric elastomer layer 2 during the operation of the dielectric elastomer transducer A1. Therefore, failures such as electrical disconnection of the core wires 41A, 41B at the power supply points 6A, 6B are reliably prevented, which is desirable for improving the durability of the dielectric elastomer transducer A1.

Figure 3:
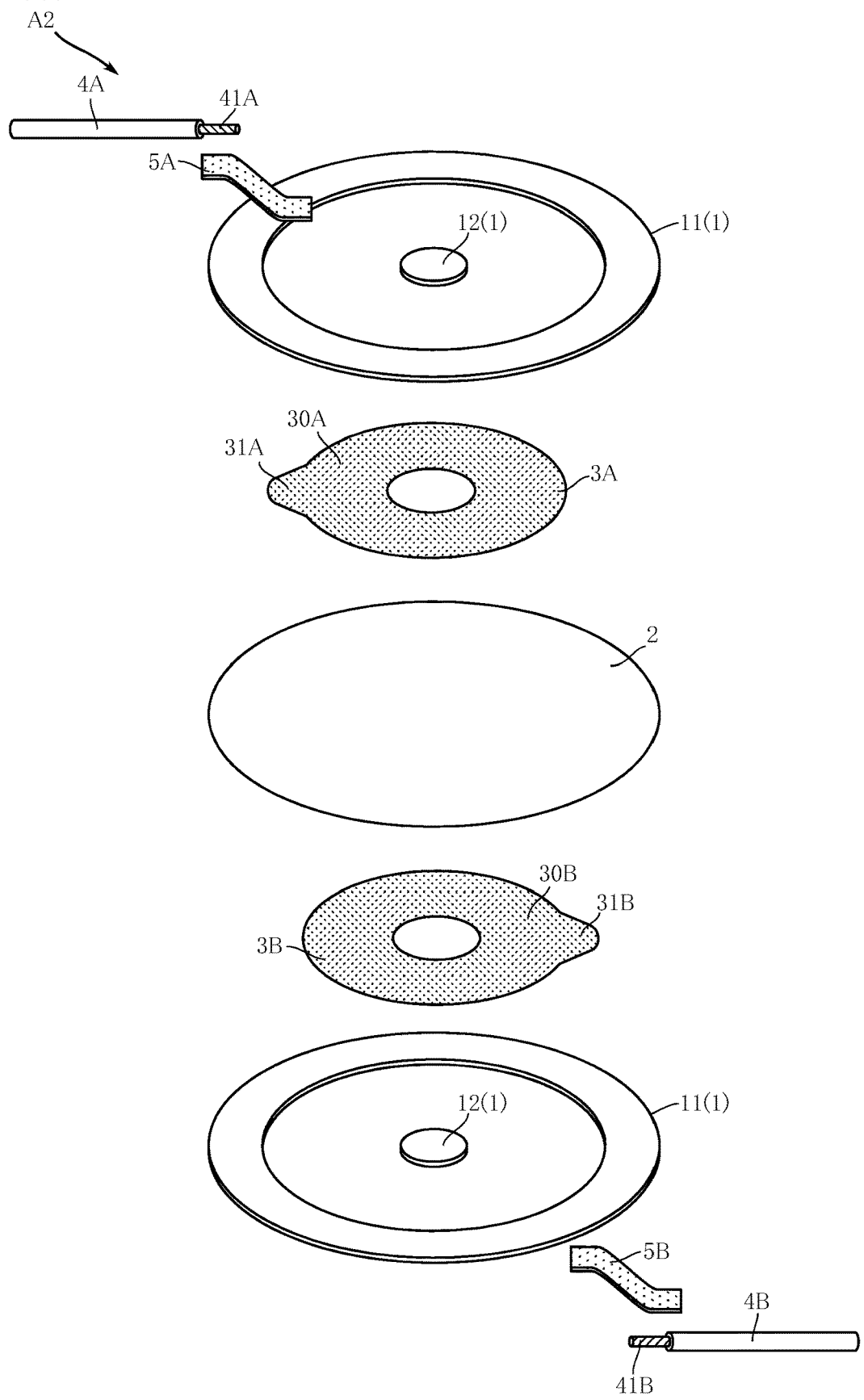
FIG. 3 is an exploded perspective view showing a dielectric elastomer transducer according to a second embodiment of the present invention.
Figure 4:
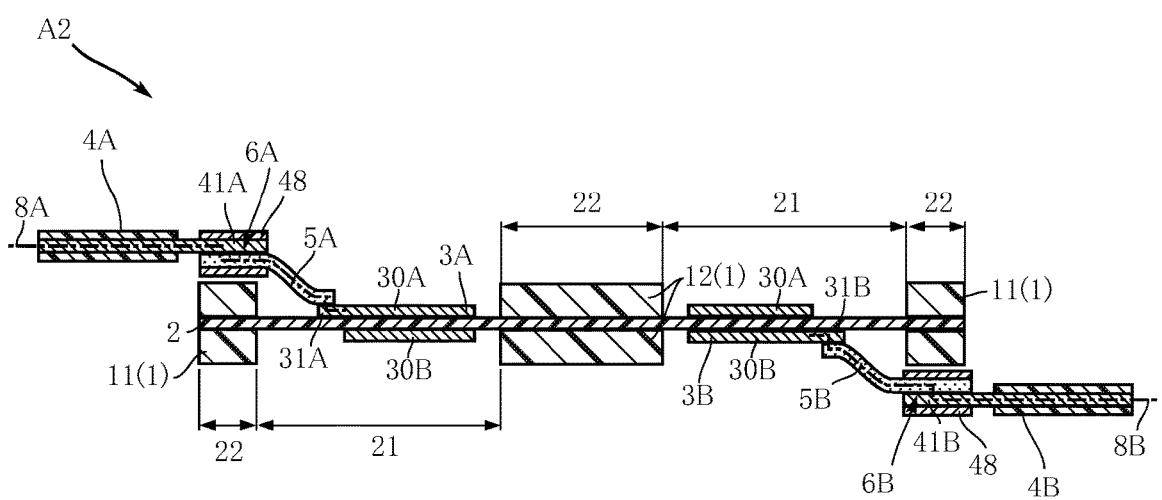
FIG. 4 is a sectional view showing the dielectric elastomer transducer according to the second embodiment of the present invention.

FIGS. 3 and 4 show another embodiment of the present invention. In these figures, the elements that are identical or similar to those of the foregoing embodiment are denoted by the same reference signs as those used for the foregoing embodiment.

FIGS. 3 and 4 show a dielectric elastomer transducer according to a second embodiment of the present invention. The dielectric elastomer transducer A2 of the present embodiment differs from the foregoing embodiment mainly in configuration of the intermediate conductive members 5A, 5B.

The intermediate conductive members 5A, 5B in the present embodiment are made of electrically conductive fabric, for example. Such fabric is formed by weaving conductive fibers and has moderate flexibility and elasticity.

The electrode layers 3A, 3B of the present embodiment have main parts 30A, 30B and extensions 31A, 31B, as with the foregoing embodiment. The entirety of each of the electrode layers 3A, 3B is arranged in the movable region 21. The main parts 30A and 30B sandwich a part of the movable region 21 of the dielectric elastomer layer 2. The extension 31A does not overlap with the main part 30B as viewed in plan. Also, the extension 31B does not overlap with the main part 30A as viewed in plan.

As shown in FIG. 4, the intermediate conductive member 5A is bonded for electrical connection to the electrode layer 3A. The intermediate conductive member 5B is bonded for electrical connection to the electrode layer 3B. Such bonding for electrical connection between the intermediate conductive members 5A, 5B and the electrode layers 3A, 3B may be performed by using the same material as the material that forms the electrode layers 3A, 3B. Specifically, in the present embodiment, the intermediate conductive member 5A is bonded for electrical connection to the extension 31A of the electrode layer 3A, and the intermediate conductive member 5B is bonded for electrical connection to the extension 31B of the electrode layer 3B.

In the illustrated example, the core wire 41A of the power cable 4A is electrically connected to the intermediate conductive member 5A with a crimping sleeve 48, and the core wire 41B of the power cable 4B is electrically connected to the intermediate conductive member 5B with a crimping sleeve 48. Each crimping sleeve 48, also called a ring sleeve, applies a physical pressure to the core wire of a cable along with a connection target to connect these while establishing conduction. Note that the technique to electrically connect the core wires 41A, 41B and the intermediate conductive members 5A, 5B is not limited.

In the present embodiment, the point at which the core wire 41A is electrically connected to the intermediate conductive member 5A with a crimping sleeve 48 is a power supply point 6A. Also, the point at which the core wire 41B is electrically connected to the intermediate conductive member 5B with a crimping sleeve 48 is the power supply point 6B.

In the present embodiment again, a conduction path 8A passing through the power supply point 6A is established. Specifically, the conduction path 8A includes the core wire 41A of the power cable 4A, the intermediate conductive member 5A and the electrode layer 3A. Also, a conduction path 8B passing through the power supply point 6B is established. Specifically, the conduction path 8B includes the core wire 41B of the power cable 4B, the intermediate conductive member 5B and the electrode layer 3B.

In the present embodiment again, failures such as electrical disconnection of the core wires 41A, 41B at the power supply points 6A, 6B are prevented, which improves the durability of the dielectric elastomer transducer A2. The use of the intermediate conductive members 5A and 5B made of conductive fabric makes it possible to provide the power supply points 6A, 6B at locations sufficiently spaced apart from the movable region 21 while arranging the entirety of the electrode layers 3A, 3B in the movable region 21. Note that the points of the intermediate conductive members 5A, 5B that are electrically connected to the core wires 41A, 41B (i.e., the power supply points 6A, 6B) may be fixed to e.g. the frame parts 11 of the support 1 or may be separated from the frame parts 11.

The extensions 31A and 31B, to which the intermediate conductive members 5A, 5B are bonded for electrical connection, do not overlap with the main parts 30B and 30A, respectively, as viewed in plan. That is, the extensions 31A, 31B are on the portions of the dielectric elastomer layer 2 within the movable region 21 that do not positively expand or contract when a voltage is applied to the electrode layers 3A, 3B. Thus, during the operation of the dielectric elastomer transducer A2, deformation of the extensions 31A, 31B is prevented, which is preferable to prevent the electrical disconnection of the intermediate conductive members 5A, 5B.

Note that unlike the example shown in FIGS. 3 and 4, the electrode layers 3A, 3B may include only portions corresponding to the main parts 30A, 30B. With such a configuration again, electrical disconnection of the core wires 41A, 41B at the power supply points 6A, 6B is prevented by bonding the intermediate conductive members 5A, 5B for electrical connection to the electrode layers 3A, 3B.

The dielectric elastomer transducer according to the present invention is not limited to the foregoing embodiments. The specific configuration of each part of the dielectric elastomer transducer according to the present invention may be varied in design in many ways.

Clause 1. A dielectric elastomer transducer comprising:
a dielectric elastomer layer;
a pair of electrode layers sandwiching the dielectric elastomer layer; and
a support that supports the dielectric elastomer layer,
wherein the dielectric elastomer layer includes a movable region separated from the support and a fixed region supported by the support,
a pair of conduction paths are established each of which is configured to conduct electricity to a respective one of the electrode layers via a power cable and a power supply point at which a core wire of the power cable is electrically connected, and
the power supply points are separated from the movable region of the dielectric elastomer layer.

Clause 2. The dielectric elastomer transducer according to clause 1, further comprising a pair of intermediate conductive members,
wherein the electrode layers are electrically connected to the intermediate conductive members, respectively, and the power supply points are provided by electrically connecting the core wires of the power cables and the intermediate conductive members.

Clause 3. The dielectric elastomer transducer according to clause 2, wherein the intermediate conductive members are supported by the support.

Clause 4. The dielectric elastomer transducer according to clause 2, wherein the intermediate conductive members are made of a material capable of deformation including bend, expansion and contraction and electrically connected to the electrode layers in the movable region, and
the power supply points are provided by electrically connecting the core wires of the power cables and portions of the intermediate conductive members that are separated from the movable region.

The invention claimed is:

1. A dielectric elastomer transducer comprising:
a dielectric elastomer layer;
a pair of electrode layers sandwiching the dielectric elastomer layer;
a support that supports the dielectric elastomer layer, and
a pair of intermediate conductive members each having one end and an other end,
wherein the dielectric elastomer layer includes a movable region separated from the support and a fixed region supported by the support,
a pair of conduction paths are established each of which is configured to conduct electricity to a respective one of the pair of electrode layers via a power cable and a power supply point at which a core wire of the power cable is electrically connected,
power supply points are separated from the movable region of the dielectric elastomer layer,
the pair of intermediate conductive members are made of a material capable of deformation including bend, expansion and contraction and electrically connected to the pair of electrode layers in the movable region at the one end,
the power supply points are provided by electrically connecting the core wire of the power cable and the other end of each of the pair of intermediate conductive members that are separated from the movable region of the dielectric elastomer layer, and
the pair of intermediate conductive members are not supported by other members except at the one end and the other end of each of the pair of intermediate conductive members.

2. The dielectric elastomer transducer according to claim 1, wherein the pair of intermediate conductive members are supported by the support.

* * * * *